United States Patent [19]
Ito et al.

[11] Patent Number: 5,269,401
[45] Date of Patent: Dec. 14, 1993

[54] RAIL FOR CONVEYING INTEGRATED CIRCUITS WITH J-SHAPED LEADS

[75] Inventors: Akihiko Ito, Gyoda; Hiroto Nakamura, Kazo, both of Japan

[73] Assignee: Advantest Corporation, Tokyo, Japan

[21] Appl. No.: 923,514

[22] Filed: Aug. 3, 1992

[30] Foreign Application Priority Data

Aug. 12, 1991 [JP] Japan .............................. 3-063624[U]

[51] Int. Cl.⁵ .............................................. B65G 11/10
[52] U.S. Cl. ................................ 193/25 FT; 193/2 R
[58] Field of Search .............. 193/2 R, 33, 38, 25 FT; 198/836.1

[56] References Cited

U.S. PATENT DOCUMENTS 4,171,736  10/1979  Scheidegger .................... 193/38

FOREIGN PATENT DOCUMENTS

| 0044410 | 3/1985 | Japan | 193/2 R |
| 0145004 | 7/1986 | Japan | 193/33 |
| 0169415 | 7/1986 | Japan | 193/2 R |
| 0036208 | 2/1987 | Japan | 193/25 FT |
| 0185612 | 8/1987 | Japan | 193/25 FT |
| 0089529 | 4/1989 | Japan | 193/2 R |

Primary Examiner—James R. Bidwell
Attorney, Agent, or Firm—Staas & Halsey

[57] ABSTRACT

Both side walls of a channel groove for guiding integrated circuits with J-shaped leads are formed at an angle greater than 90 degrees to the bottom of the channel groove.

4 Claims, 3 Drawing Sheets

PRIOR ART
FIG. 1A   FIG. 1B
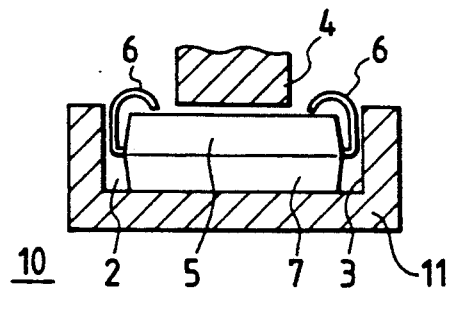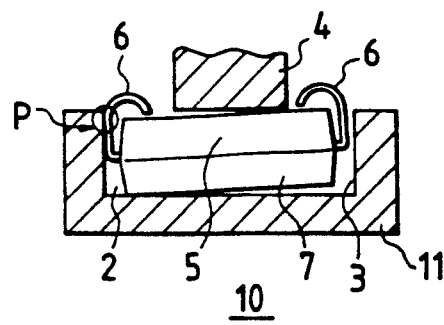
PRIOR ART
FIG. 2A   FIG. 2B
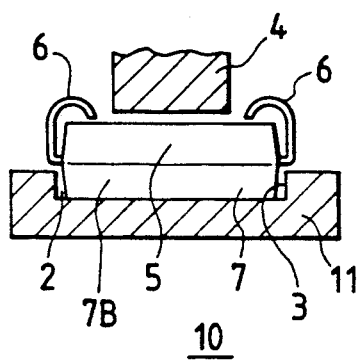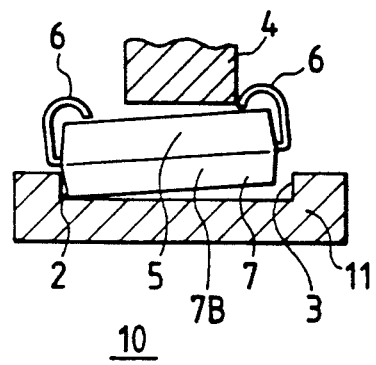
PRIOR ART
FIG. 3A   FIG. 3B
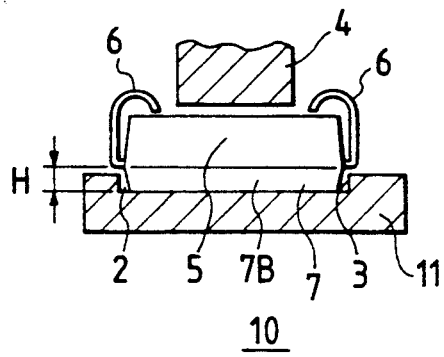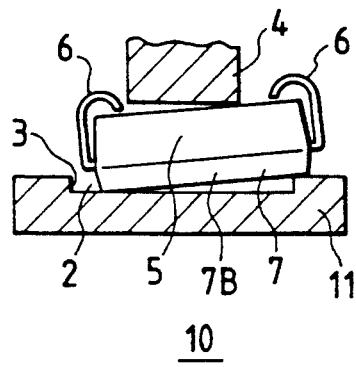

RAIL FOR CONVEYING INTEGRATED CIRCUITS WITH J-SHAPED LEADS

BACKGROUND OF THE INVENTION

The present invention relates to an integrated circuit conveying rail for use in an IC tester, for example, and more particularly, to a rail for conveying integrated circuits with J-shaped leads.

A description will be given first, with reference to FIGS. 1A, 1B, 2A, 2B and 3A, 3B, of three conventional rails for conveying integrated circuits (hereinafter referred to as ICs) with J-shaped leads. In the case of testing a number of ICs 5 in an IC manufacturing process, IC conveying rails 10 are needed to convey the ICs to an IC testing section in a sequential order and convey tested ICs from the IC testing section to an unloading section where the tested ICs are sorted and loaded accordingly. Such an IC tester is disclosed in, for example, U.S. Pat. No. 4,691,831 or 4,715,501.

FIGS. 1A, 1B, 2A, 2B and 3A, 3B are cross-sectional views of the IC conveying rail 10 and the IC 5 which is conveyed thereon. The rail 10 is formed by a cascade connection of a plurality of rail units each of which has a rectangularly-sectioned channel groove 2 for receiving and guiding ICs 5 and is long enough to receive a plurality of ICs 5. Reference numeral 3 indicates side wall of the channel groove 2. The rail 10 slides thereon the ICs 5 to convey them in succession from a loading section to the IC testing section and thence to the unloading section, but since the ICs 5 are distributed to a plurality of rails or reversed in direction on their way to the testing section or unloading section, some rail units are abruptly translated in the lateral direction or some other rail units are abruptly turned around. Thus, some rail units are abruptly driven, and consequently, the ICs mounted on such rail units receive great shocks in directions other than that in which they are conveyed; therefore, after mounting the ICs 5 on the rail 10, a roof 4 extending along the channel groove 2 is disposed above the rail 10 to prevent the ICs 5 from jumping up. Reference numeral 7 denotes a molded portion of each IC 5.

When the rail 10 is abruptly driven as mentioned above, the ICs 5 collide against side walls 3 in the channel groove 2 of the rail 10, with the result that J-shaped leads may sometimes be deformed. In the example shown in FIGS. 1A and 1B the channel groove 2 is so deep that the leads 6 are almost hidden, and the side walls 3 are upright at right angles to the bottom 2B of the channel groove 2. This prior art example is a lead guide type wherein the ICs 5 are guided in the channel groove 2 by the leads 6 alone, and when the rail 10 is abruptly driven as mentioned above, the leads 6 may sometimes collide at their tip end portions P with the side walls 3 as depicted in FIG. 1B. Since the tip end portion P of each lead 6 is appreciably apart from its base, the shock that the tip end portion P receives from the side wall 3 applies a great bending stress to the base of the lead 6 through leverage, deforming the lead 6 in some cases.

The prior art example of FIGS. 2A and 2B is a mold guide type wherein the channel groove 2 is shallow and the ICs 5 are guided by the lower half portions 7B of their molded portions 7 although the side walls 3 are perpendicular to the bottom 2B of the channel groove 2 as is the case with the example of FIGS. 1A and 1B. In this instance, the leads 6 may be deformed by collision with the roof 4. When the channel groove 2 is formed shallow corresponding to the thickness of the lower half portion 7B of the molded portion 7 indicated by H in FIG. 3A, there is a case where the ICs 5 get out of the channel groove 2 as depicted in FIG. 3B. Also in this case, the leads 6 may be deformed by stress.

SUMMARY OF THE INVENTION

It is therefore an object of the present invention to provide an IC conveying rail which does not essentially deform J-shaped leads of ICs and prevents the ICs from getting out of the channel groove during conveyance.

According to the present invention, the IC conveying rail has a construction wherein both side walls of the channel groove are each formed at an angle greater than 90 degrees to its bottom so that the channel groove may have an inverted trapezoidal cross-section.

BRIEF DESCRIPTION OF THE DRAWINGS

FIG. 1A is a cross-sectional view of a conventional IC conveying rail;

FIG. 1B is a diagram showing a collision of an IC with a side wall of the channel groove in FIG. 1A;

FIG. 2A is a cross-sectional view of another conventional rail;

FIG. 2B is a diagram showing a collision of an IC with a roof in FIG. 2A;

FIG. 3A is a cross-sectional view of still another conventional rail;

FIG. 3B is a diagram showing an IC getting out of the rail depicted in FIG. 3A;

DESCRIPTION OF THE PREFERRED EMBODIMENT

Figure 4A:
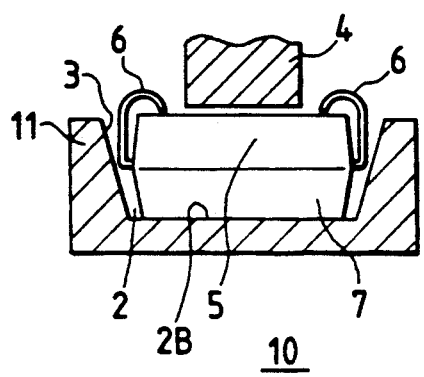
FIG. 4A is a cross-sectional view of the IC conveying rail according to the present invention.
Figure 4B:
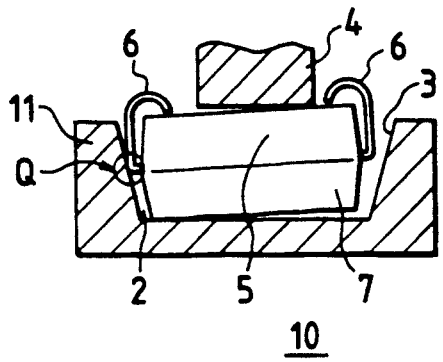
FIG. 4B is a diagram showing a collision of an IC with the side wall of the channel groove in the example of FIG. 4A.

A description will be given first of the basic structure of the IC conveying rail according to the present invention. FIGS. 4A and 4B are cross-sectional views of the conveying rail 10 at right angles to its longitudinal direction and the IC 5 which is mounted on the rail for conveyance, the parts corresponding to those in FIGS. 1A through 3B being identified by the same reference numerals. The rail 10 has a base plate 11 in which the channel groove 2 having a substantially inverted trapezoidal cross-section, for guiding ICs, is formed lengthwise of the base plate 11. The channel groove 2 is slightly wider than the width of the IC 5 in each horizontal plane and is long enough to receive a plurality of ICs 5. The side walls 3 of the channel groove 2 slope so that its width becomes gradually small as the bottom 2B is approached. The roof 4, disposed above the center of the channel groove 2 widthwise thereof, is fixed to the base plate 11 by some means not shown and extends in parallel to the channel groove 2 to prevent the IC 5 from jumping up therefrom.

The IC conveying rail of the present invention is the aforementioned lead guide type wherein the IC 5 is guided in the channel groove 2 by the leads 6 alone. The present invention has its feature in that the both side walls 3 of the channel groove 2 for guiding the IC 5 are formed at an angle greater than 90 degrees to the bottom 2B of the groove 2. With such a construction, only 90-degree bent portions Q of the leads 6 of the IC 5 are allowed to contact the side walls 3 of the channel groove 2 as shown in FIG. 4B. Since the bent portions Q are each in close proximity to the bases of the leads 6, the shock that the bent portion Q receives when colliding against the side wall 3 is smaller than the force applied to the base of the lead 6 in the case of FIG. 1B and there is substantially no possibility of the leads 6 being permanently deformed. Moreover, since the rail 10 of the present invention is the lead guide type, the ICs will not get out of the channel groove 2, no matter how small the thickness H of the molded portion 7 may be.

Figure 5:
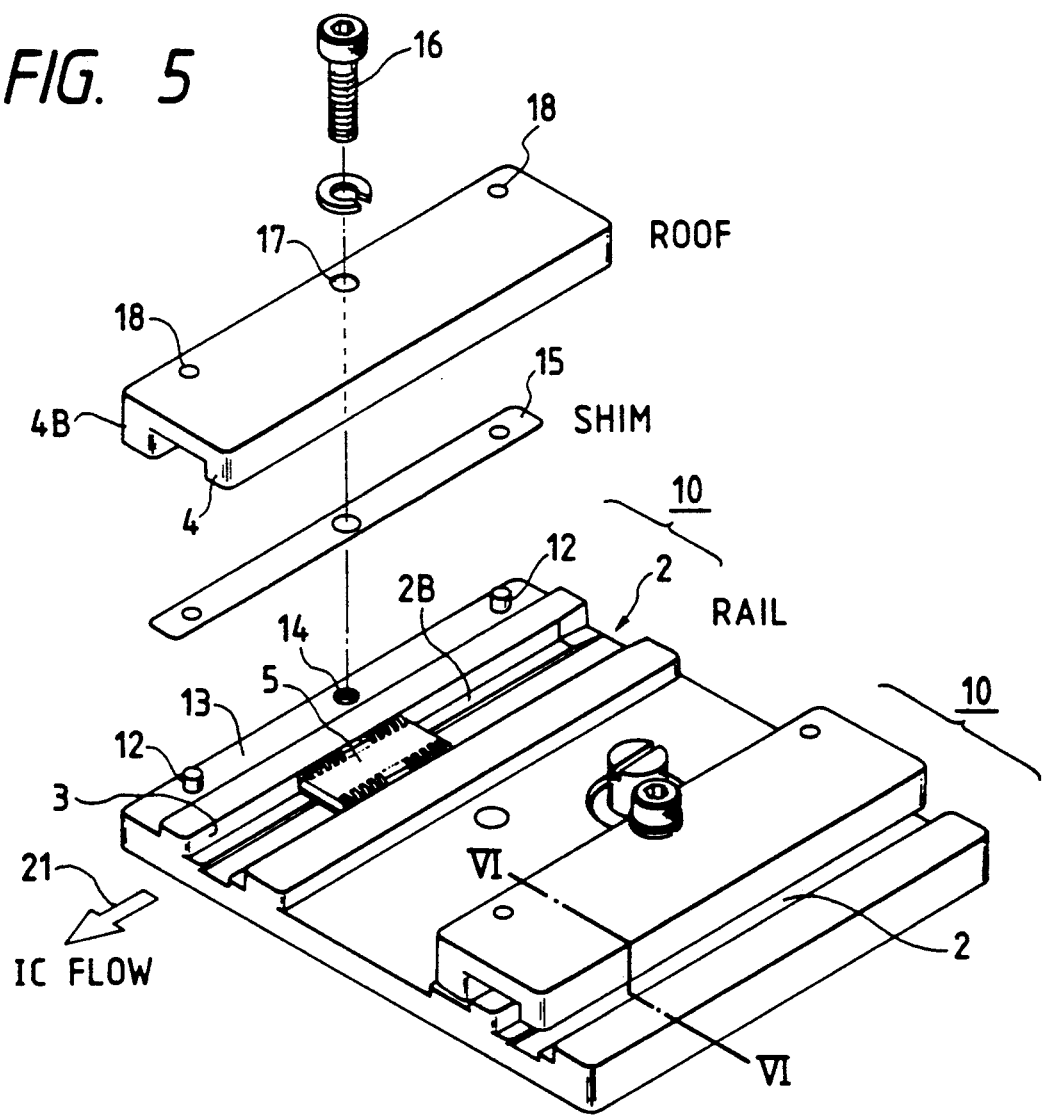
FIG. 5 is an exploded perspective view illustrating a specific operative example of a rail unit according to the present invention.
Figure 6:
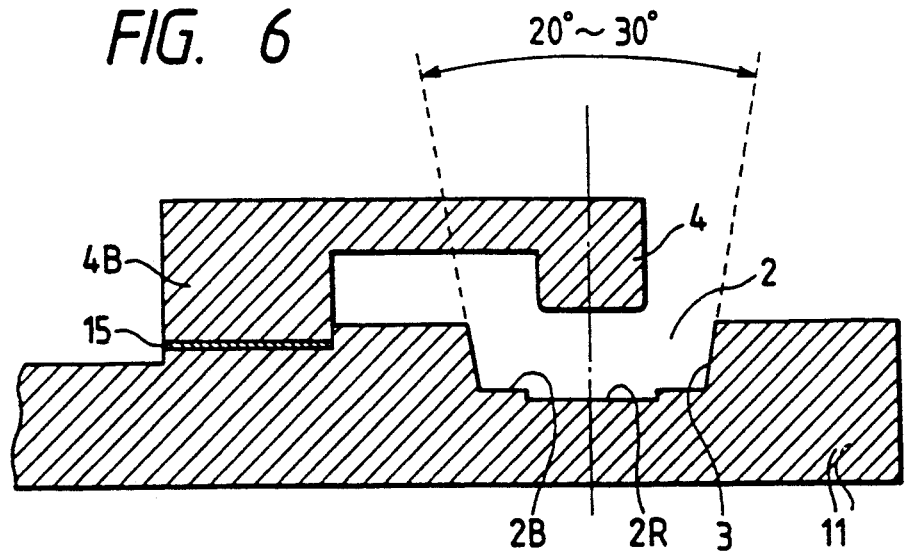
FIG. 6 is a cross-sectional view taken on the line VI—VI in FIG. 5.

FIG. 5 illustrates a specific operative example of the rail unit forming the IC conveying rail 10 according to the present invention, and FIG. 6 is a cross-sectional view taken on the line VI—VI in FIG. 5. In this embodiment the base plate 11 is substantially rectangular and two parallel, spaced-apart channel grooves 2 are formed in the top surface of the rectangular base plate 11 along its both side margins in such a manner as to provide two rails 10 in parallel relationship. In FIG. 5 one of the rails 10 is shown as an exploded view. The side walls 3 of the channel groove 2 slope at an angle greater than 90 degrees to its bottom 2B so that the groove 2 may have an inverted trapezoidal cross-section. The angle of inclination of each side wall 3 to the bottom 2B may preferably be in the range of 100 to 105 degrees. Consequently, the both side walls 3 make an angle of 20 to 30 degrees as shown in FIG. 6.

Figure 7:
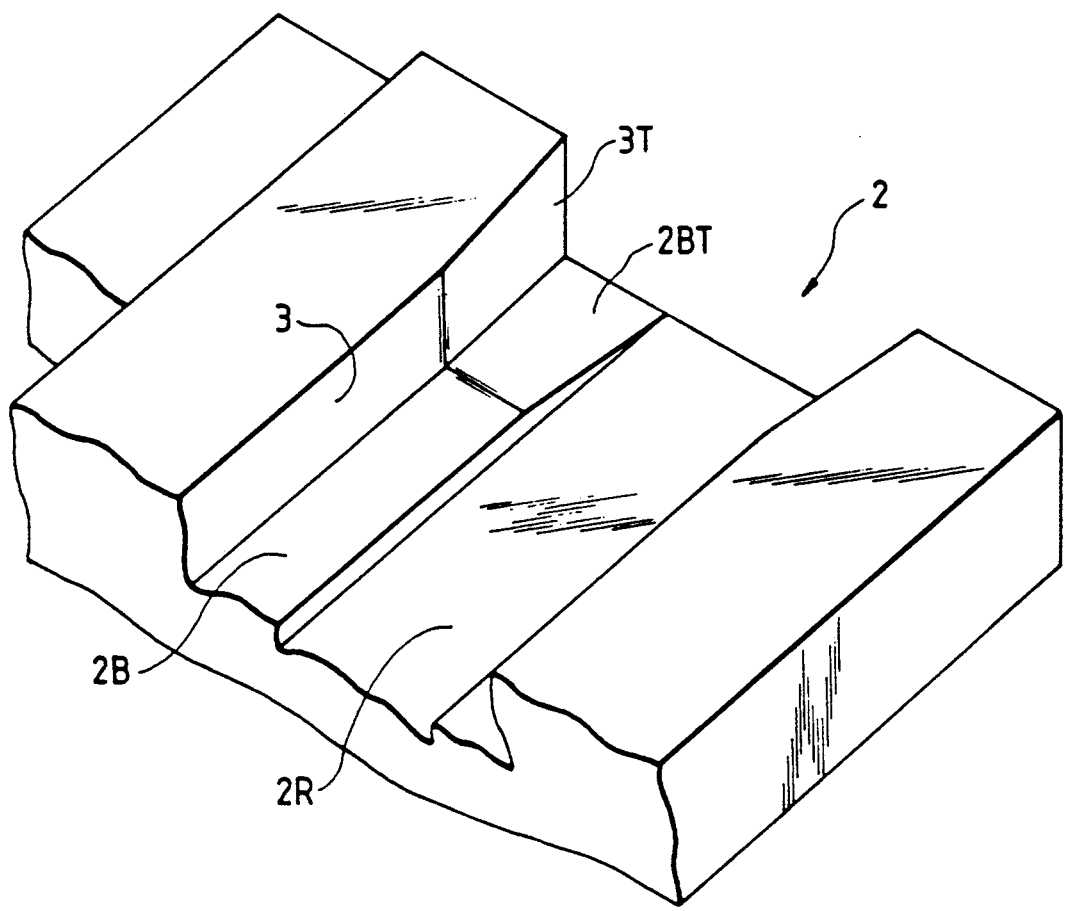
FIG. 7 is an enlarged perspective view showing an IC entrance of the channel groove 2 and its vicinity in FIG. 5.

At one side of each channel groove 2 there is formed a stepped portion 13 which extends along the groove 2. Provided on the top of the stepped portion 13 are projections for engagement. Each roof 4 has formed integrally therewith a downward support portion or flange 4B which extends the entire length of the roof 4 along one of its marginal edges. The support portion 4B has a through hole 17 and holes 18 for engagement with the projections 12. The support portion 4B is rested and detachably fixed to the stepped portion 13 of the base plate 11 with a shim 15 of a suitable thickness sandwiched therebetween, with the projections 12 received in the holes 18 and a screw 16 threadably engaged with a tapped hole 14 made in the stepped portion 13. In this embodiment there is formed in the bottom 2B of the channel groove 2 a shallow concavity 2R narrower than the width of the bottom 2B so as to reduce friction between the bottom 2B and the IC 5 which slides thereon in the direction indicated by the arrow 21. In order that the open end portion of the channel groove 2 for receiving ICs 5 may be larger in width and depth than in the intermediate portion of the rail unit, the side walls 3 and bottom 2B of the channel groove 2 near the open end portion thereof are provided with tapered faces 3T and 2BT as shown on an exaggerated scale in FIG. 7.

A plurality of such rail units are disposed with their channel grooves 2 held in alignment on a slope of a rack or frame not shown, forming the IC conveying rail 10 in an IC tester.

As described above, the IC conveying rail according to the present invention is very simple in that the both side walls 3 of the channel groove 2 forming the rail for guiding thereon the IC with J-shaped leads are formed at an angle greater than 90 degrees to the bottom of the groove 2, but the rail of the present invention is completely free from the deformation of the J-shaped leads and derailment of ICs which have been experienced in the past. Accordingly, the present invention, though simple in construction, permits easy conveyance of ICs with J-shaped leads.

It will be apparent that many modifications and variations may be effected without departing from the scope of the novel concepts of the present invention.

What is claimed is:

1. A rail unit for conveying integrated circuits with J-shaped leads, comprising:
   a substantially rectangular base plate having at least one channel groove formed in the top surface thereof along the length thereof, said channel groove being defined by side walls which are formed at an angle greater than 90 degrees to the bottom of said channel groove; and
   a roof unit with a roof having one end thereof detachably fixed to at least one portion of said channel groove and having another portion extending above said channel groove in parallel relationship therewith; and
   wherein the opening of said channel groove at one end thereof is greater in width and depth than the opening of said channel groove in the intermediate portion of said base plate.

2. The conveying rail of claim 1 wherein said bottom of said channel groove has formed therein a shallow concavity which is smaller in width than said bottom and extends along said channel groove.

3. The conveying rail of claim 1 or 2 wherein said side walls of said channel groove are each formed at an angle of 100 to 105 degrees to said bottom of said channel groove.

4. The conveying rail of claim 1 wherein a plurality of said rail units are disposed with their channel grooves held in alignment.

* * * * *